US012034422B1

(12) United States Patent
Doty et al.

(10) Patent No.: US 12,034,422 B1
(45) Date of Patent: Jul. 9, 2024

(54) ENHANCED ELECTRONIC SENSORS

(71) Applicant: National Technology & Engineering Solutions of Sandia, LLC, Albuquerque, NM (US)

(72) Inventors: Fred Patrick Doty, Livermore, CA (US); Bryant R. Morgan, Stockton, CA (US); Isaac C. Avina, Brentwood, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 323 days.

(21) Appl. No.: 17/477,160

(22) Filed: Sep. 16, 2021

(51) Int. Cl.
*H03H 3/007* (2006.01)
*H03H 3/04* (2006.01)

(52) U.S. Cl.
CPC ... *H03H 3/0072* (2013.01); *H03H 2003/0428* (2013.01); *H03H 2003/0457* (2013.01)

(58) Field of Classification Search
None
See application file for complete search history.

(56) References Cited

U.S. PATENT DOCUMENTS

| | | | | |
|---|---|---|---|---|
| 2003/0205675 | A1* | 11/2003 | Nelson | G01T 1/2928 250/370.09 |
| 2014/0216539 | A1* | 8/2014 | Johnston | H10K 10/82 438/98 |

OTHER PUBLICATIONS

Beckerle, et al., "Charged Particle Detection in Organic Semiconductors", In Nuclear Instruments and Methods in Physics Research Section A: Accelerators, Spectrometers, Detectors and Associated Equipment, vol. 449, Nos. 1-2, Jul. 11, 2000, pp. 302-310.
Campbell, et al., "Metal-Organic Frameworks as Active Materials in Electronic Sensor Devices", In Sensors, vol. 17, No. 1108, 2017, 11 pages.
Scher, et al., "Anomalous Transit-Time Dispersion in Amorphous Solids", In Physical Review B, vol. 12, No. 6, Sep. 15, 1975, 23 pages.
Wilson, et al., "Order and Charge Collection Correlations in Organic Materials for Neutron Detection", In Proc. of SPIE, vol. 6707, 2007, pp. 670710-1-670710-8.
Wilson, et al., "Postpolymerization Alignment of Bulk Conjugated Polymers", In Applied Physics Letters, vol. 93, No. 143304, 2008, pp. 143304-1-143304-3.

* cited by examiner

*Primary Examiner* — Edwin C Gunberg
(74) *Attorney, Agent, or Firm* — Eschweiler & Potashnik, LLC; Madelynne J. Farber; Samantha Updegraff

(57) ABSTRACT

A micro-structured device that can improve sensitivity and signal-to-noise for electronic sensor materials is embedded in electrically resistive materials. The technology includes a three-dimensional embedded electrode structure and fabrication methods for making the device for electronic sensing in bulk resistive materials. Embedded electrode structures address issues in conventional sensors by allowing independent control of sensitive material thickness, area, electric field intensity, and field direction.

20 Claims, 16 Drawing Sheets

| Table 1: Estimation of Charge Collection Efficiency | | |
|---|---|---|
| Quantity | Magnitude | Units / Remarks |
| Dye module output | | |
| Pulse E | 1.5E-06 | J |
| = | 9.4E+12 | eV |
| Photon wavelength | 590 | nm |
| Photon energy | 2.1 | eV |
| Photon output | 4.5E+12 | photons/pulse |
| Flux | | |
| Spot diameter | 1.0 | mm |
| Optical efficiency | 0.8 | 3% reflection, each surface |
| Flux at sample | 4.4E+14 | photons/cm² |
| Incident photons | | |
| Sample width (gap) | 32 | microns |
| Sample length | 1.0 | mm |
| Sample area | 3.2E-04 | cm² |
| Photons incident on sample | 1.4E+11 | photons/pulse |
| Absorption | | |
| Film thickness, b | 2.0E-03 | cm |
| Absorption coef, cm-1 | 2.0E+03 | see note for definitions |
| Photon fraction absorbed | 0.9817 | = 1 - (I/I₀) |
| Excess carriers | | |
| Photons absorbed | 1.4E+11 | = (incident photons) x (1 - R) |
| $\eta$ | 0.10 | Quantum Efficiency |
| Excess carriers | 1.4E+10 | N₀ = Photons absorbed x Q.E. |
| Collected carriers | | |
| Signal level | 1 | mV |
| Charge amp sensitivity | 1.0 | mV/fC |
| Q | 1.0E-15 | coulombs |
| N = Q/q | 6.25E+03 | carriers collected |
| Collection efficiency per mV | | |
| c.c.e. | 4.475E-07 | = N/N₀ = Q/N₀q |
| volts | | 32 |
| field, V/cm | 1.00E+04 | |
| M = c.c.e. x L / E | 1.432E-13 | |

FIG. 8 ial, a boron-containing material, or combinations thereof. The electrode structure has a length, width, and height each extending at least 0.1 mm.

ENHANCED ELECTRONIC SENSORS

STATEMENT OF GOVERNMENTAL INTEREST

This invention was made with Government support under Contract No. DE-NA0003525 awarded by the United States Department of Energy/National Nuclear Security Administration. The Government has certain rights in the invention.

FIELD

The technology disclosed herein relates to devices for electronic sensing in dielectric materials.

BACKGROUND

Materials that may be highly attractive for bulk sensing applications due to selective interaction with specific analytes often find limited application because of poor electronic transport. Some sensing applications require bulk or thick film materials to produce sufficient signals. Examples include chemical sensing based on bulk absorption, charged particle sensing where the ionization signals generated in thin films are too weak to distinguish from background, and neutral particle sensing, where thick material is required to increase cross-section.

In such cases, surface electrode structures may not adequately sense signals. Simple planar electrodes may require high voltage to produce adequate electric fields or may be insensitive to subsurface charge in disordered materials due to limited drift (dispersive transport also called transit time dispersion). Surface electrodes may also block analytes from intimate contact with the sensitive material.

In other cases, planar electrodes can interfere with the sensing mechanism by blocking chemical or optical access. Other surface structures such as transmission lines, Auston switches, and interdigital electrodes, produce high fields only at the material surface. For anisotropic materials, surface electrodes may produce small or no fields in the sensitive direction.

In bulk sensing materials, charge carrier mobility depends on electric field strength as well as electrode spacing. By contrast, carrier mobilities in conductors and semiconductors are independent of electric field and device scale. Accordingly, semi-conductor technology is not applicable to solve these issues in sensor technology.

SUMMARY

The following is a brief summary of subject matter that is described in greater detail herein. This summary is not intended to be limiting as to the scope of the claims.

As mentioned above, some sensing applications require bulk or thick film materials to produce sufficient signals; however, surface electrode structures may not adequately sense signals due to limited electric field distributions and poor charge transport. As a solution to the problems discussed herein, a micro-structured device that can improve sensitivity and signal-to-noise for electronic sensor materials is embedded in such materials. The technology includes a three-dimensional embedded electrode structure and fabrication methods for electronic sensing in bulk materials. Embedded electrode structures address these issues by allowing independent control of sensitive material thickness, area, electric field intensity, and field direction.

In an embodiment, an electronic sensor device includes: an electrically resistive sensing material selected from the group consisting of: a polymer, an oxide, a metal-organic framework material, a boron-containing material, lithium-containing material, gadolinium-containing material, or combinations thereof; a three-dimensional electrode structure having a length, width, and height extending at least 0.1 mm; a power source coupled to terminals of the electrode; a voltage source; and circuitry configured to detect changes in current across the electrodes.

In an embodiment, a method for detecting radiation with an electronic sensor device, includes the steps of: energizing three dimensional electrodes that are at least partially embedded in an electrically resistive material to form an electric field across channels formed by facing portions of the three-dimensional electrodes; detecting current upon radiation encountering the sensing material and the electric field migrating ionized charges from the electrically resistive material towards the electrodes. The electrically resistive sensing material is selected from the group consisting of: a polymer, an oxide, a metal-organic framework material, lithium-containing material, gadolinium-containing mater- The above presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIG. 8 is Table 1 with calculations discussed herein.

DETAILED DESCRIPTION

Figure 1:
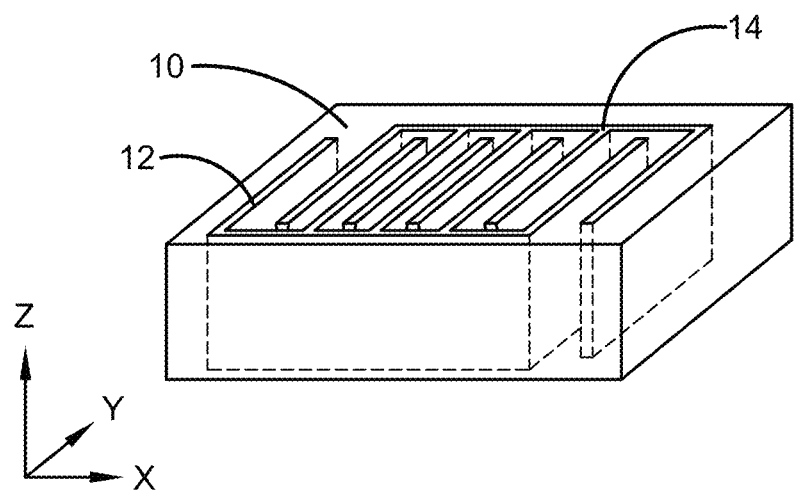
FIG. 1 is a partial see-through view of an embodiment of the enhanced sensor device.

Various technologies are presented herein pertaining to an electronic sensing material with enhanced sensing capabilities, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices may be shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something and is not intended to indicate a preference.

Many electrically resistive materials (e.g., insulators) such as polymers, oxides, boron-containing materials, lithium-containing material, gadolinium-containing material, and metal-organic framework materials, or combinations of these, exhibit selective interaction with specific analytes, making them attractive candidates for electronic sensor applications. However, most of these resistive materials have poor signal propagation, often limited by trap states that cause dispersive charge transport. In such materials, charge carrier mobility appears to depend on electric field strength as well as electrode spacing. By contrast, carrier mobilities in conductors and semiconductors are independent of electric field and device scale. Thus, the practical width, thickness and sensitivity of sensors based on materials with dispersive transport is severely limited.

Conductive polymers are largely organic materials that are somewhat conductive, e.g., charge can move through the material, but not to the extent of materials classified as dielectric materials. Polyaniline, poly(paraphenylenevinylene), polythiophene are examples. The conductive polymer may have a pi-conjugated structure. Conjugation in the chemical structure produces an energy gap in the material. These materials are also electrically resistive and are of interest for electronic sensing because they have high cross-sections for fast neutron detection. Lithium-containing materials and gadolinium containing material are useful sensitizing agents for neutrons.

Polymers are nearly transparent to x-ray and gamma radiation; but hydrogen nuclei (protons) in polymers strongly scatter fast neutrons, making them attractive for selective neutron detection. The scattered nuclei (recoil protons) efficiently ionize polymers, but dispersive charge transport severely limits the practical thickness and therefor sensitivity of polymeric materials. For example, Beckerle and Ströbele reported inefficient detection of ionizing particles in polyacetylene. Charged particle detection in organic semiconductors, Beckerle P. and Ströbele H., Nuclear Instruments and Methods in Physics Research Section A: Accelerators, Spectrometers, Detectors and Associated Equipment, Volume 449, Issues 1-2, 11 Jul. 2000, Pages 302-310 DOI: 10.1016/S0168-9002(00)00255-2. Stretching the polymer sheet increased carrier mobility in the stretch direction, but decreased mobility through the thickness of the films. They noted that: "Charge transport perpendicular to the preferred direction requires higher drift fields than used in our experiments. The small effective thickness of the used foils leads to a rather low detection efficiency even for the doubly charged α-particles." In the present work, poly(p-phenylene vinylene) (PPV) was studied for fast neutron detection and similar effects to what Beckerle and Ströbele described were noticed.

For adequate cross-sectional depth, practical fast neutron detectors should be at least millimeters in thickness, but our experiments showed only modest charge collection for micron thickness films. Stretch-orientation increased charge collection in the plane of the films but decreased transport through the thickness. Therefore, for either unstretched or stretched bulk films, simple planar designs with top and bottom planar electrodes are inefficient.

Coplanar electrode designs such as interdigital electrodes (IDE) apply fields in the plane of the film, however, the field strength falls off rapidly below the electrode surface. Hence, surface IDE designs are insensitive to subsurface signals, again limiting the effective thickness.

In an embodiment disclosed herein, an electronic sensing material is embedded, i.e., at least partially embedded, with three-dimensional electrode structures therein, in order to generate high electric fields throughout the sensitive material and enhance sensing of selected analytes. By three-dimensional, it is meant that the electrode structures extend to a substantial degree in all three dimensions (x, y, z or width, length, height), e.g., at least 0.1 mm, at least 0.5 mm, or at least 1 mm in all directions. By going into the third dimension, i.e., the depth of the sensing material, the footprint of the device can remain the same while the sensitivity is enhanced. In an embodiment, the electrode has a height extending deeper into the sensing material than its smallest width or length. In other words, the electrode has a z-dimension depth, that is greater than either its x-width or y-length dimension. In an embodiment, the electrode has a z-dimension depth greater than both the x and y dimension.

The embedded electrode structures described here overcome limitations of conventional planar electrodes applied to materials with dispersive transport. In such materials, surface electrode structures may not adequately sense signals due to limited charge transport, may block analyte from intimate contact with the sensitive material, and may produce low fields in the sensitive direction or at depth in anisotropic bulk materials. In addition, devices with conventional electrodes do not scale linearly in dispersive materials, that is the increase in collected charge is not linearly related to the strength of the electric field or the width of the channel. Embodiments with embedded electrode structures disclosed herein enable independent control of sensitive material thickness, area, channel width, electric field intensity and field direction, rendering effective enhanced electronic sensing in bulk resistive materials with dispersive charge transport.

Materials that can be used with the sensing device include: polymers, metal oxides, and metal organic framework materials. Polymers may include, for example, aromatic or π-conjugated polymers. Pi-conjugated polymers typically contain long chains of alternating single and double carbon—carbon bonds and are characterized by overlapping of π orbitals across the formal single bonds. Polyacetylenes are representative of the class of π-conjugated polymers. Block copolymers, comprising segments of alternating single and double carbon—carbon bonds, and segments containing single carbon—carbon bonds, are also part of the general class comprising π-conjugated polymers. Because of their high electrical resistivities (i.e., $1/\sigma \geq 10^9$ ohm·cm), π-conjugated polymers such as polyacetylenes, polyfluorines, polyphenylenes, polypyrrole, polyaniline, polythiophene, and derivatives of the foregoing, such as for example poly(p-phenylenevinylene), poly(2,5-dioctyloxy-p-phenylenevinylene), poly(1-methoxy-4-(2-ethylhexyloxy)-2,5-phenylenevinylene), poly(3,4-ethylene dioxythiophene), and poly(3-octylthiophene), can function as radiation detection materials that exhibit very low leakage currents. Pi conjugation enables polymers to function but is not necessary for charge dispersive mobility. Conductive materials may include a hopping type: amorphous selenium is an example.

In an embodiment, the material is stretched in a direction that is orthogonal to the cut into the material for the embedded electrode and parallel to the surface of the material. (See FIG. 1.) Stretching aligns the polymer chains and enhances charge mobility.

The bulk material can also be an oxide, such as porous or chemiresistive oxide, for example, films of $SnO_2$, ZnO or CdO and porous chemiresistive sensors such as semiconducting carbon nanotubes.

In an embodiment, the bulk sensing material can be a boron-containing material. Boron has a very high cross-section for neutrons, and thus materials including boron can be used as neutron sensing base materials in the device. Examples of boron-containing materials include boron nitride, a hexagonal compound with a small polaron and other boron compounds with this characteristic. Boron carbide ($B_4C$) is another example. Boron covalent organic framework materials (COFs) are another example. The boron does not need to be part of the conductive phase, and could be dispersed in a conductive polymer, or at grain boundaries in a polycrystalline semiconductor.

In an embodiment, metal organic framework (MOF) materials could be advantageous for this type of sensor, due to their high surface areas and synthetic adaptability. Conventionally, MOFs do not possess electrical properties suitable for conventional electrodes. According to a recent review of MOF based sensors: "Use of MOFs as the active material in chemiresistive sensors has only recently been investigated, in large part due to the lack of MOFs with suitable electrical conductivity." Metal—Organic Frameworks as Active Materials in Electronic Sensor Devices, Michael G. Campbell and Mircea Dincă, Sensors 2017, 17(5), 1108; DOI: 10.3390/s17051108, incorporated herein by reference. However, the embedded enhancement of the sensor disclosed herein would improve the ability of MOFs to effectively work in this manner. A variety of MOF materials could be used to detect various types of chemicals, such as those that are conductive. An example MOF is MOF $Cu_3(2,3,6,7,10,11$-hexaiminotriphenylene$)_2$.

In an embodiment, the device is not configured as a semi-conductor or used as a semi-conductor. Furthermore, MOF materials have not been successfully used as semi-conductors but could be used as the sensor disclosed herein.

Electrode structures can be designed to minimize both conducting channel width and occluded area, and the sensitive volume can be increased by extending electrode depth. For anisotropic material the structure can be aligned to apply high electric field in the direction of maximum sensitivity.

The electrode can be made of a conductive material, such as carbon, metal-loaded polymers (e.g., Ag-loaded epoxies), gold plated conductive material, or electroplated copper.

FIG. 1 shows PPV patterned in an interlocking finger configuration of an electrode and a second electrode with deep channels made by reactive ion etching. The finger configuration may also be described as the electrode having a continuous width with multiple extensions extending length-wise along the continuous width. In an embodiment, at least some of the multiple extensions of the electrode are interpolated between at least some of the multiple extensions of the second electrode.

Figure 2:
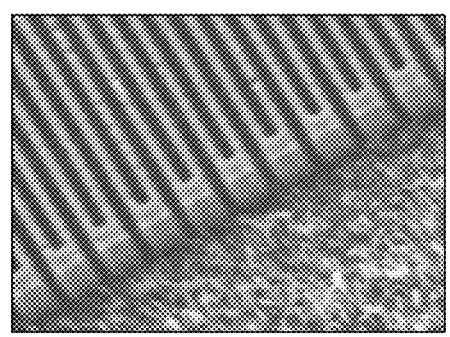
FIG. 2 is an SEM photograph of the radiation sensitive polymer.

FIG. 2 shows a similar comb pattern with an SEM image of a radiation sensitive PPV material.

The electrode structure could also be formed by, for example, electroplating a metal into the channel. Alternatively, the channels could be backfilled with a material comprising a carbon-loaded elastomer to form a flexible sensor.

The embedded electrode concept can be extended to other geometries and repeated to form sensor arrays. In an embodiment, an annular bulk sensing material is formed with an electrode embedded at a central axis area and a metal tube surrounding the axis as another electrode.

Figure 3:
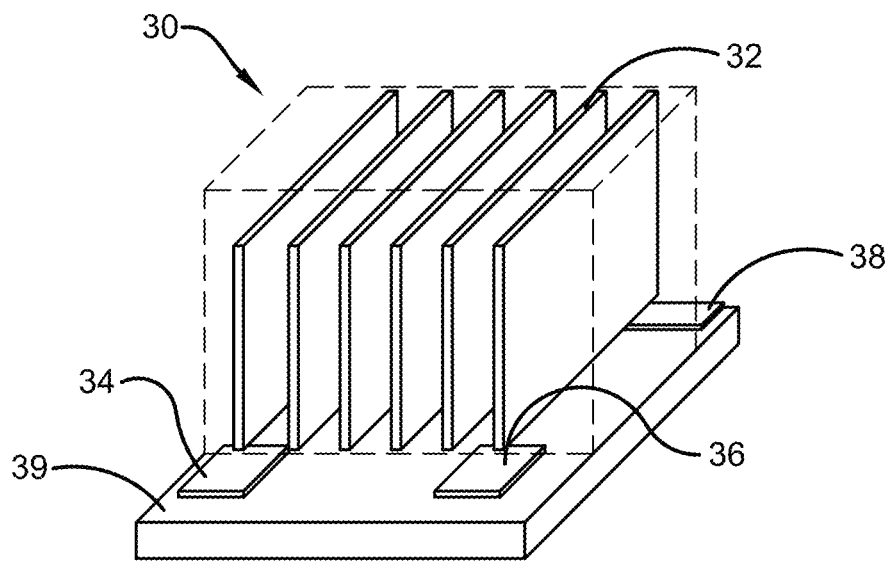
FIG. 3 is a partial see-through view of an embodiment of the enhanced sensor device.

An example of a voltage division position sensing particle detector employing embedded electrodes 32 is illustrated in FIG. 3. The embedded electrodes 32 are embedded in a radiation sensitive polymer 30. This type of sensor employs a resistive strip 38 to distribute applied voltage uniformly among the embedded electrodes 32. The components are coupled to or supported by a substrate 39.

The resistive strip 38 connects to each of the embedded electrodes 32 making a voltage divider. Two amplifier channels produce output signals generated in proportion to the horizontal position of ionizing particle events. That is, if there are 11 electrodes, then the total voltage drop V across the resistive strip 38 is divided by 10, putting V/10 between each pair of adjacent electrodes. When an ionizing particle hits at the nth pair of electrodes, the current is divided proportionately at the output electrodes 34, 36; the fractional current is n/10 at one output and (10−n)/10 at the other.

Figure 4:
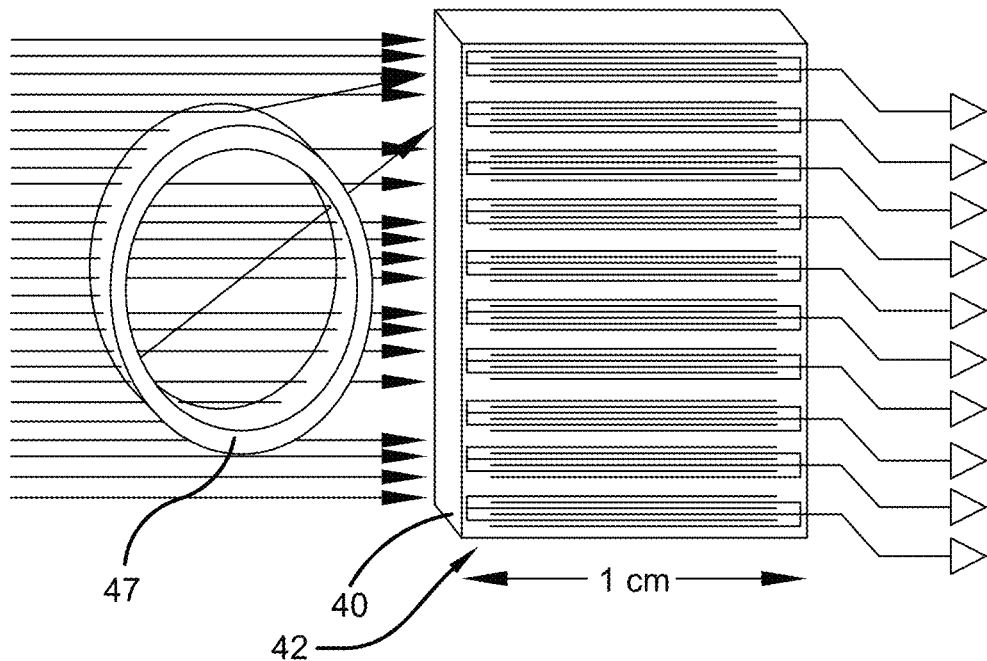
FIG. 4 is a schematic of an enhanced sensor device in operation.

In another embodiment, a linear array geometry for fast neutron radiography in a radiation sensitive bulk media 40 is illustrated in FIG. 4. Fast neutrons produce a kinematic distribution of recoil protons in the radiation sensitive bulk media 40, with maximum momentum transfer in the direction of the incoming neutron. The embedded electrode array 42 illustrated presents $1 \times 1 \times 10$ mm$^3$ voxels aligned with the neutron beam to give maximum sensitivity and image contrast, while the small collection channel length (vertical) is aligned with the high mobility direction to ensure maximum signal to noise.

In FIG. 4, the cylindrical object 47 is being radiographed. The rays represent neutron trajectories. Attenuation by scattering and absorption is max at the top and bottom where the neutron path through the object is greatest. Contrast is enhanced geometrically because scattered neutrons are no longer in alignment with the array axis and are not efficiently detected.

The channel width (i.e., distance between electrodes) may vary based on the material and electrode geometry. The mobility of the charge also depends on the electric field applied, though it is not typically a linear relationship. Accordingly, the drift length, on which a figure of merit for the channel width would be based will be a function of the field strength. The channel width (i.e., the distance of the planar surface of one electrode finger to another one facing its widest side) may be, e.g., 1 to 200 microns, such as 5 to 100 microns, or 10 to 75 microns. This may depend on the (highly nonlinear) dispersive mobility-trapping time product, $\mu\tau$. Preferred channel width, w, would match $\mu\tau E$, where E is the electric field applied. The difficult to determine variable is that dispersive $\mu$ depends on w and so appears to depend on E. Thus, one could develop a device geometry to maximize signal to noise at a reasonable applied voltage=wE for the application.

The depth of the electrode from a top surface of the sensing material, i.e., the depth it is embedded into the sensing material, may be, e.g., 10 to 1000 microns, such as 20 to 800 microns, or 50 to 250 microns. These dimensions can also be the depth of the electrode itself. The capacitance of the device increases as the electrode depth increases. Sources of noise are related to capacitance and higher capacitance causes leakage current through the device. For this reason, selecting a sensing material with a low dielectric constant, e.g., permittivity close to one, such as 20 to 1, 5 to 1, or 1.5 to 1, as a permittivity near 1 may make it feasible to configure the device so that all current detected is signal. The overall depth of the sensing material may be, for example, 15 to 2000 microns, such as 21 to 1000 microns, or 55 to 300 microns. The electrode depth is typically at or near the active material thickness but may be different for some reason. It might be greater than the active material thickness to extend into a substrate below, or above through some encapsulating layer. If it is less than the active layer thickness, the device will be less efficient, but it may be needed for higher fields to avoid arcing at a surface or interface.

Although not shown in the figures, the embedded electrodes of the device are coupled to a power source. The power source provides a voltage across the terminals of the device, which could be in a range, for example from of 5 to 2000 volts. Voltage selection would depend largely on channel width, material, and device type. In some devices, the best noise to signal ratio may be at 100 to 500 volts, such as 150 to 450, or 200 to 400 volts. Avalanche photodiodes typically operate at less than 30 volts, e.g., 5 to 25, or 10 to 20 volts. PMTs have much lower dark count rates and may operate at high levels such as 750 to 1500 volts, such as 800 to 1300, or 900 to 1200 volts. The power source can supply alternating or direct current.

The device is monitored for changes in current due to the analyte detection events. In an embodiment, the device is monitored with amplifier positioned nearby the device that is capacitively coupled to it and configured to detect changes in current across the electrodes. In turn, the amplifier can be coupled to a computing device for processing of signal. In an embodiment, the material may have an opening from the exterior to the electrode embedded in the material for coupling the electrodes, or the electrodes may simply protrude out of the material of the device, so they are exposed to the exterior.

Either additive or subtractive manufacturing can be used to produce the sensing material and ready it for the embedded electrodes. For the electrode formation, viable methods include casting, screen printing, electroplating, reactive ion etching, and laser ablation.

In the case of subtractive manufacturing, the sensing material can be patterned with channels to be filled appropriately. In an embodiment, a CNC mill machine with up to 5- or 6-axis capabilities is used to create channels in the bulk sensing material. Then a conductive material, (metal) is deposited in the channels. Other subtractive manufacturing devices may also be used, such as a lathe, plasma cutter, or electric discharge machine.

The metal electrode structures can also be fashioned from a solid block by one of the above subtractive manufacturing procedures and then the polymeric or other sensing material is then filled in around the electrode structure, embedding the electrodes in the sensing material.

Additive manufacturing, e.g., 3-D printing can also be used to produce a material with built in channels, which are then filled with conducive material.

Figure 5:
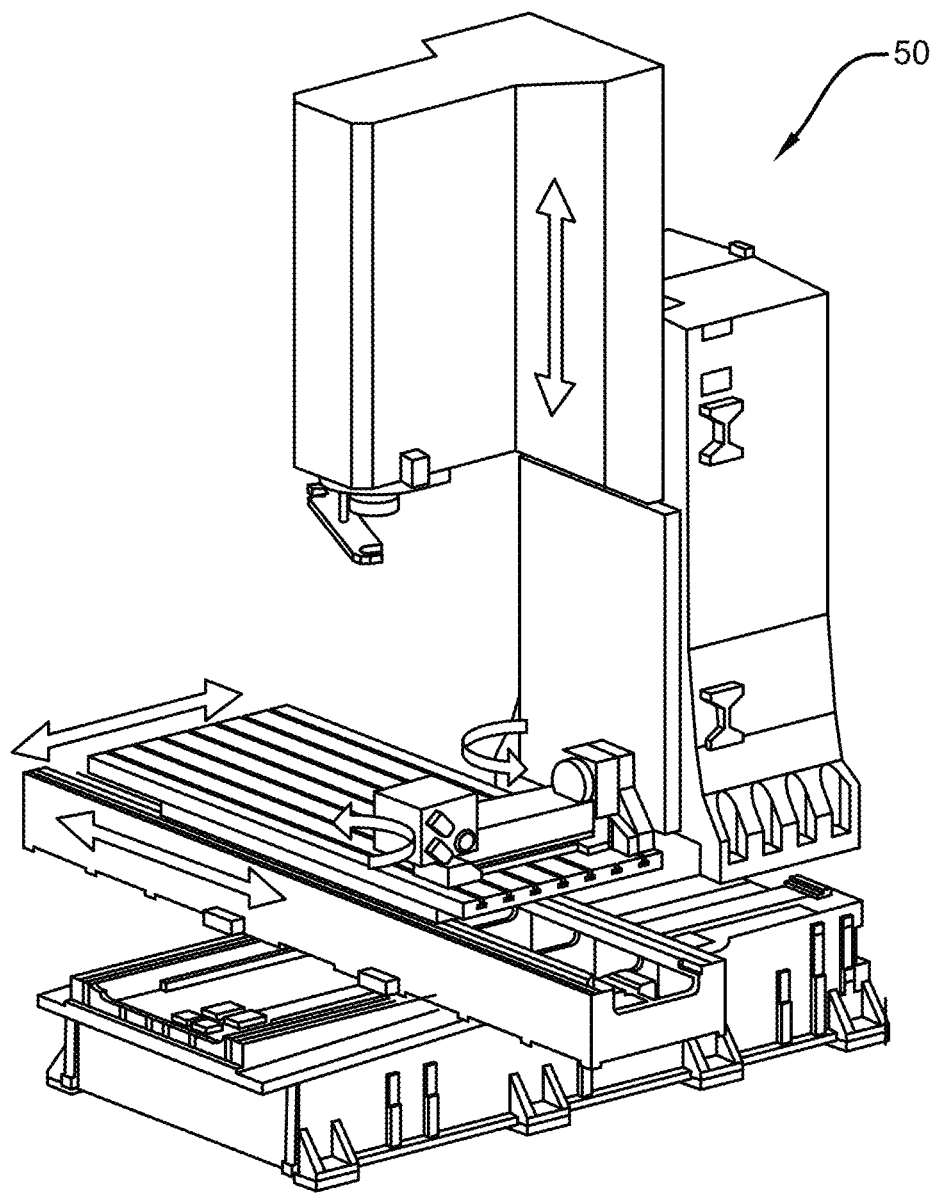
FIG. 5 is a perspective view of a 5-axis milling machine.

In an embodiment, a specialized tool can be added to a 3-axis milling machine as shown in FIG. 5. In conjunction with a computer controlled (e.g., CNC) milling machine, this fitting can be used for rapid custom shaping of sensors with embedded electrodes and non-planar surfaces. This may be especially useful in the medical radiation dosimetry application mentioned below.

In an embodiment, the device is used to detect various types of radiation, for example, weakly interacting neutral particles like gamma rays and neutrons. In another embodiment, X-ray and gamma ray photons can be detected. The type of material, the porosity (or density) of the material, and the design of the electrode determine which type of particle or radiation the device is suitable for detecting. PPV or another conducting polymer can be used for detecting ionizing radiation.

In an embodiment, the device is operated generally by energizing electrodes of the device to form an electric field across the channels between electrode portions of the device. Upon an analyte particle or radiation encountering the sensing material, the electric field migrates charge to the electrodes creating a detectable current. In a pulse mode or AC mode, individual counts of detection events are registered. This mode may be most useful for neutron particle detection. In an integrating detection mode, the total current in a defined period of time is detected. This mode may be most useful for sensing in materials that how low sensitivity for the analyte of interest.

In an embodiment, the devices can be stacked in layers, or in another embodiment, they can be non-stacked, i.e., with no underlying or other sensing devices placed between the radiation source and the device.

Figure 18:
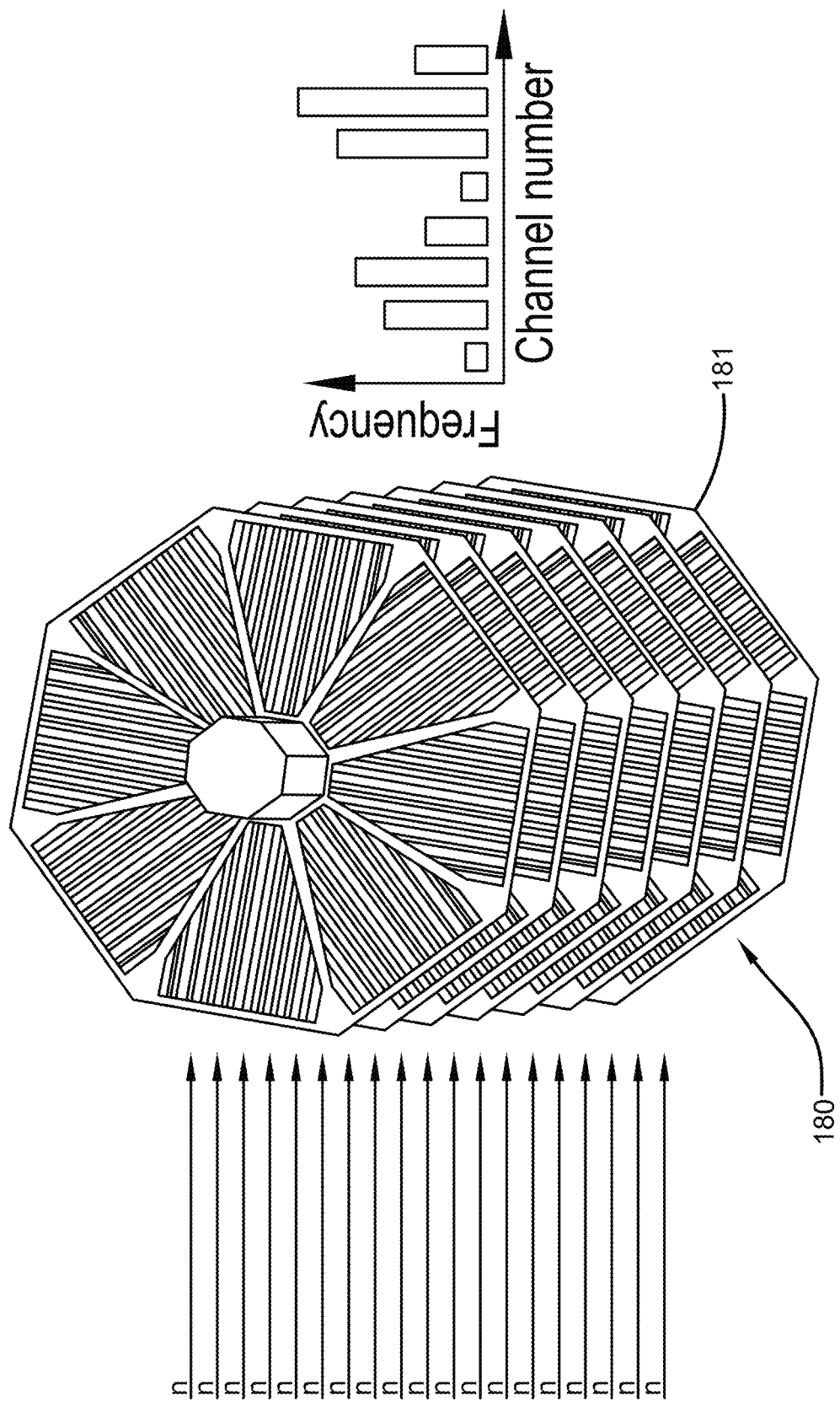
FIG. 18 is a perspective view of a stacked embodiment of the device.

FIG. 18 is a perspective view of a vertically stacked embodiment of the device 180. The device 180 makes use of stacked, segmented detector wafers 181 to increase the sensitivity. Each wafer 181 consists of a number of interdigital transducers (IDT) sectors that can be simultaneously fabricated with a single mask-etch process cycle. Each segment is oriented to provide maximum signal levels from neutron flux in a different direction. The direction of the neutron flux is uniquely determined due to the collimation of recoils by the collecting electrodes. If based on 4-inch wafers with 0.1 mm thick polymer castings, each wafer would contain nearly 1 $cm^3$ of sensitive material. In an embodiment, these dimensions may vary by plus or minus 1000%, 100%, or 25%.

Such polymer films elastically scatter several percent of normally incident fission spectrum neutrons, according to validated modeling performed on this project. Since the sensitivity can be increased by stacking, compact imaging systems with sensitivity similar to large moderator-capture detector systems appear feasible.

In an embodiment, the device can be used with external radiation therapy, especially in proton radiotherapy therapy as a dosimeter to measure the amount of protons being delivered to a patient. The therapeutic beam could be passed through the detector, where only a trivial amount of the proton beam is attenuated. The device could be operated in current detection mode in order to measure the instantaneous dose going through the device to the patient. In addition, position sensing of the beam could be achieved by providing an inter digital detector array.

In an embodiment, a custom-designed sensor material can be placed on the patient's body surface. The sensor material can be configured to match the actual shape of the tissue that is to be dosed/treated. For example, for a therapeutic beam directed to the kidneys, a sensor would be placed over the kidneys on the surface of the skin between the beam source and the targeted tissue.

Rapid production of a custom detector with a computer-controlled machine tool or laser ablation device that has capabilities of non-planar fabrication and an ability to cut channels in three-dimensions would be particularly advantageous for this embodiment. To this end, FIG. 5 shows a 5-axis CNC milling machine 50. This machine can be used to cut channels into an electrically resistive sensing material and form the material into a non-planar geometry to match a patient's body surface that will be targeted for radiation therapy.

In use, the patient can undergo therapy by directing radiation to the electronic sensing device that is over the targeted body surface. Then the sensing device is used to monitor the detected radiation for a predetermined dosage, wherein the electronic sensing device is placed on a patient in need of the medical therapy.

Figure 6:
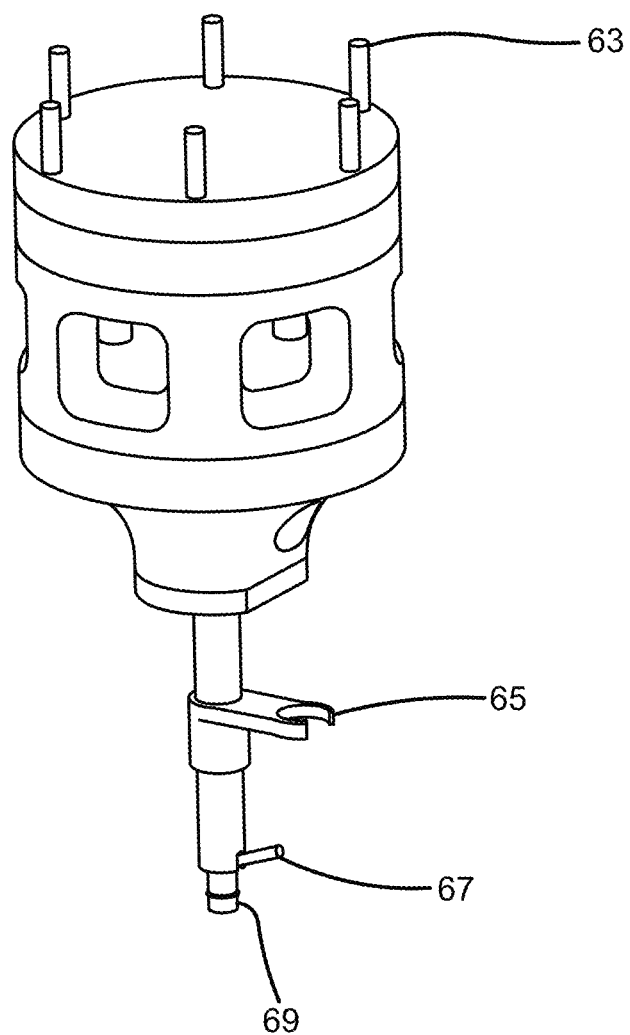
FIG. 6 is a perspective view of an embodiment of a modified tip for additive manufacturing on a milling machine.

FIG. 6 shows a custom-designed fitting for a milling machine that has a connecting portion 63 allowing it to be attached to the milling machine spindle. The side of the fitting includes a coupling 65 for a syringe or other similar container. The syringe is filled with material for the electrode in a paste-like form. Pressure is put on the syringe to push the electrode material into tube 67 leading to the hollow central area of the fitting. The fitting spins on the spindle at a controlled RPM and computer-controlled placement causing the electrode material to be pushed through the tip 69 and carefully placed into the channels of the sensing device. The 5-axis CNC machine can be used to turn the channeled material to a position conducive to receiving the electrode material.

Control of the electronic sensing device, in particular, signal processing, integration and counting can be accomplished by a computing device. Control of the manufacturing device can also be performed by a computing device.

Figure 19:
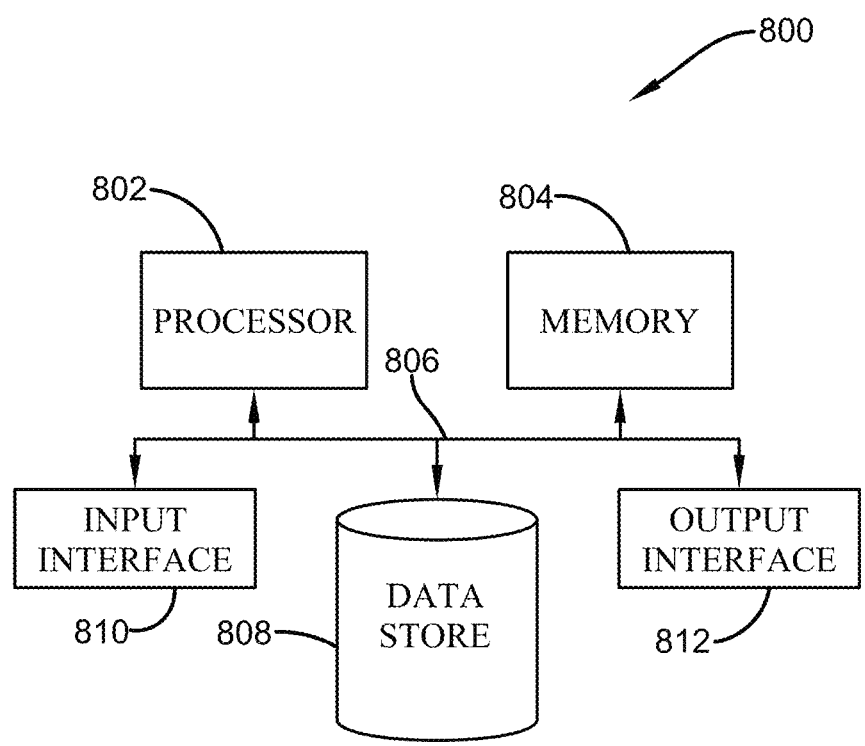
FIG. 19 is a schematic of a computing device for use with the technology disclosed herein.

Referring now to FIG. 19, a high-level illustration of an exemplary computing device 800 that can be used in accordance with the systems and methodology disclosed herein is illustrated. The computing device 800 includes at least one processor 802 that executes instructions that are stored in a memory 804. The instructions may be, for instance, instructions for implementing functionality described as being carried out by one or more components discussed above or instructions for implementing one or more of the methods described above. The processor 802 may access the memory 804 by way of a system bus 806. In addition to storing executable instructions, the memory 804 may also store image products, SAR data, etc.

The computing device 800 additionally includes a data store 808 that is accessible by the processor 802 by way of the system bus 806. The data store 808 may include executable instructions, image products, SAR data, etc. The computing device 800 also includes an input interface 810 that allows external devices to communicate with the computing device 800. For instance, the input interface 810 may be used to receive instructions from an external computer device, from a user, etc. The computing device 800 also includes an output interface 812 that interfaces the computing device 800 with one or more external devices. For example, the computing device 800 may display text, images, etc., by way of the output interface 812.

Additionally, while illustrated as a single system, it is to be understood that the computing device 800 may be a distributed system. Thus, for instance, several devices may be in communication by way of a network connection and may collectively perform tasks described as being performed by the computing device 800.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

EXAMPLES

Devices of two kinds were fabricated for this project. Simple planar interdigital transducers (IDTs) were made for material evaluation, and deep-etched microstructures were made to investigate fabrication approaches for practical neutron sensors.

Example 1

Figure 7:
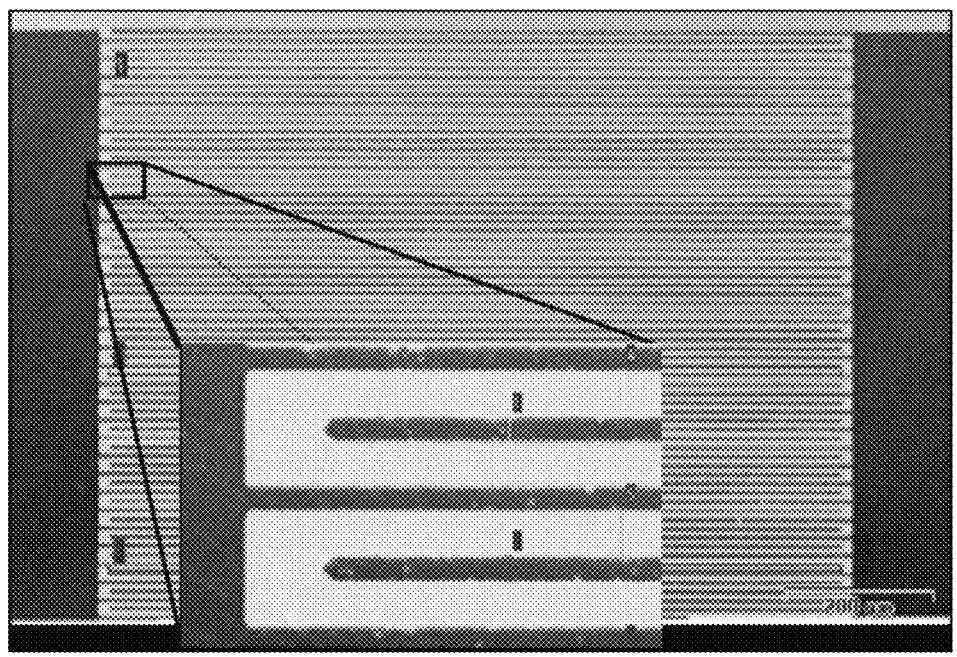
FIG. 7 is an SEM photograph with a zoomed-in inset of an embodiment of an interdigital transducer structure.

The IDTs are simple devices made by first depositing gold contacts on glass substrates, and then casting thin film electronic polymers over the top. An IDT structure is shown in FIG. 7. The basic structure has 10 mm2 active area defined between two bus bars terminating on 2 mm2 pads for hand bonding. Several geometries with a range of electrode spacing were used. The device has 4-micron electrodes separated by 12-micron gaps. The inset shows ends of the IDT fingers were rounded and terminate back from the channel ends to avoid field-concentrating effects that can cause early breakdown. Nominal 4 mm gold strips were recessed to avoid excessive fields. Nominal length and width were 10 mm, 1 mm, respectively (total sensitive IDT area 10 mm2).

The deep fabrication experiments utilized the Sandia California Microstructures Laboratory to investigate practical devices. The novel microstructures collimated and sensed ion tracks from recoil protons in the materials. Initial experiments for direct writing of deep IDT patterns employed the 3 MeV tandem accelerator. Subsequent ion machining experiments used metal masks and an Oxford reactive ion etcher to produce the desired structures.

Example 2: Photoconductivity Testing

Evaluation of the electronic and properties was performed on films cast over the planar interdigital transducer IDT electrodes as shown in FIG. 1. Materials were evaluated by IV testing, and photoconductivity using pulsed 590 nm laser light. The laser source was manufactured by Laser Sciences Inc. and employed the N2 laser line at 337 nm to excite a liquid cell containing rhodamine dye. The wavelength was tuned to the HOMO-LUMO gap energy at 2.1 eV to excite free carriers in the material. The laser intensity was measured using a Molectron pyroelectric laser power meter. The charge collected was measured with an Ortec 142A charge sensitive preamplifier, and the charge collection efficiency was evaluated based on measured absorption curves and published quantum efficiencies for photocarrier generation. An example calculation is seen in the table of FIG. 8.

Figure 9:
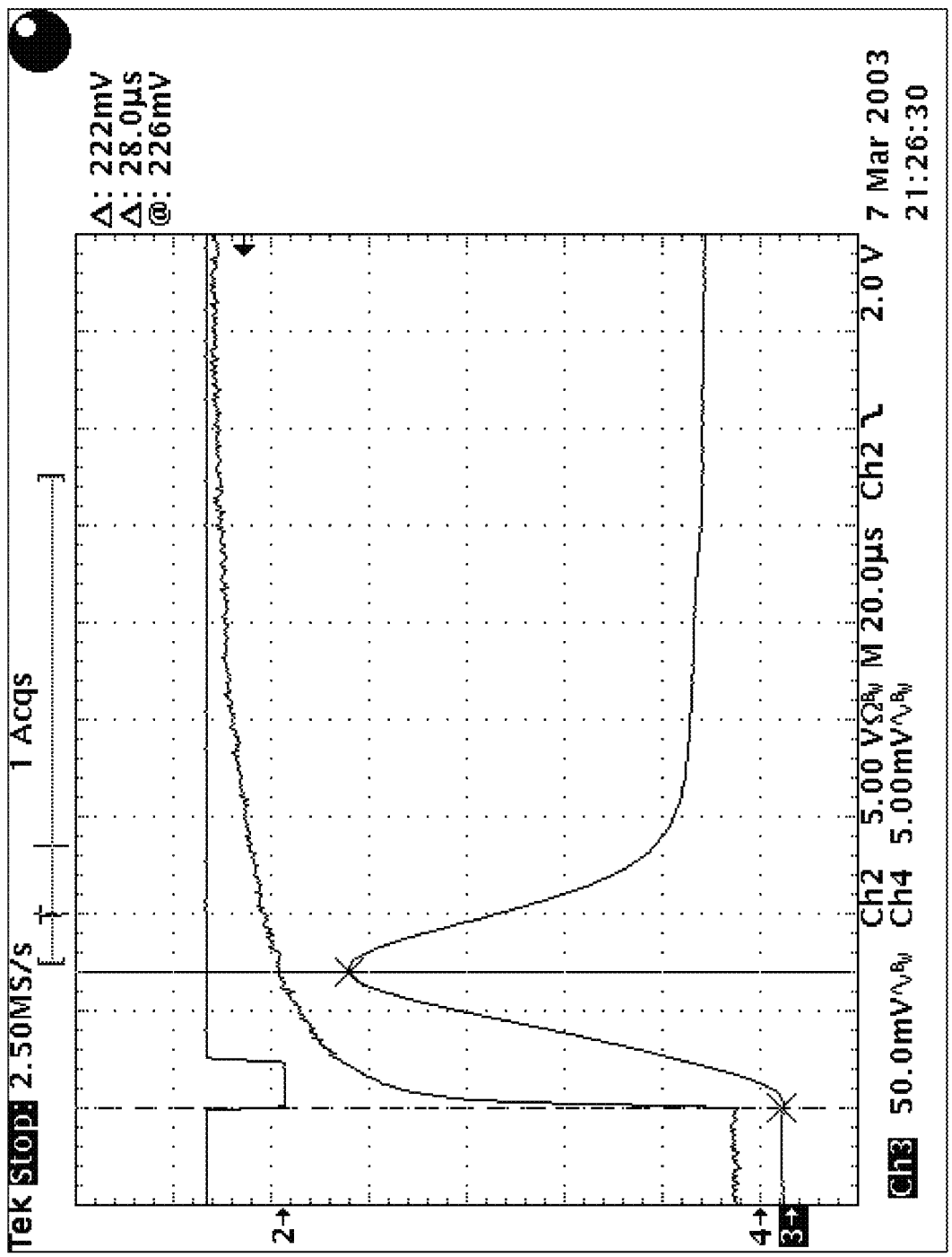
FIG. 9 is graph showing photoconductivity transient.

An evaluation of charge collection was performed. A typical photoconductivity transient is shown in FIG. 9. Incomplete charge collection is evident in the asymmetry of the shaping amp output, as well as the long transient output of the preamp. Peaking times for the preamp output are typically several hundred microseconds and are determined by convolution with the resistive reset. However, the fast components are significant. Therefore, an assumed figure of merit for counting mode operation of these devices is based on the 10 microsecond charge collection efficiency is represented by Formula (1):

$$FOM = \frac{c.c.e. \times L^2}{V} \quad (1)$$

where c.c.e. is the charge collection efficiency as estimated in Table 1, L is the electrode spacing and V is the applied voltage. (This FOM has the units of a $\mu\tau$ product, cm2/V, however, it should be noted that it is not strictly a material property since it depends strongly on the device geometry and integration time.)

Figure 10:
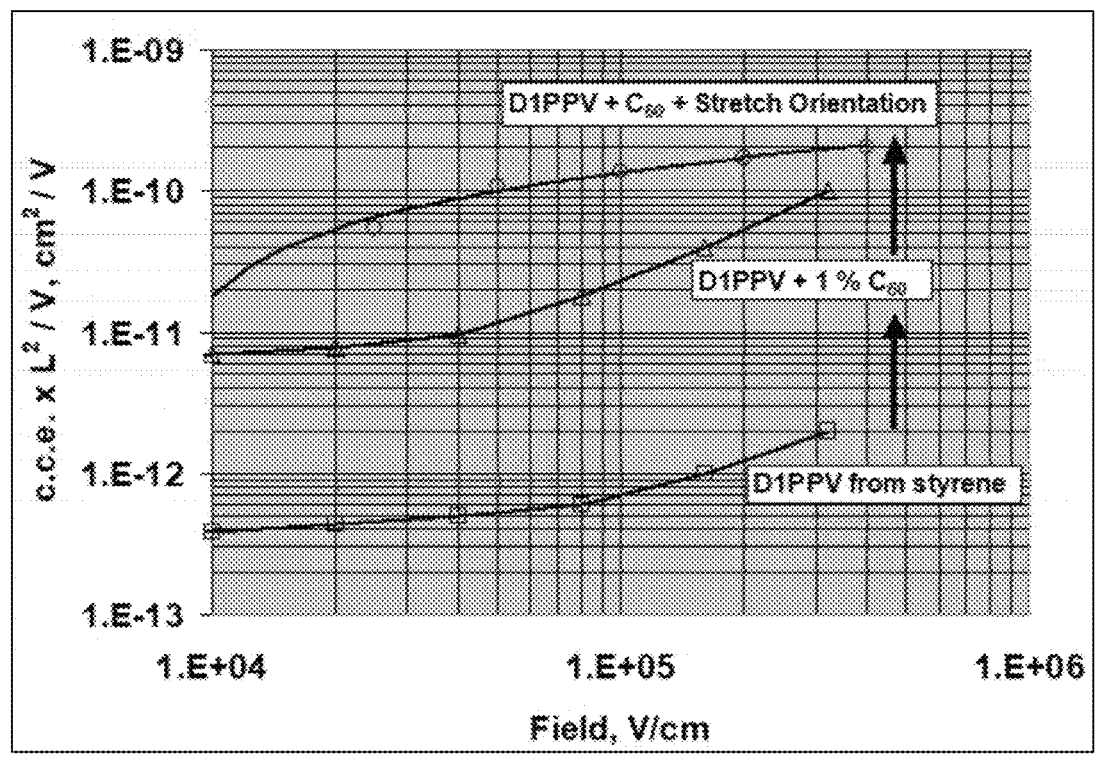
FIG. 10 is plot showing a figure of merit evaluated as a function of electric field for three D1PPV planar devices.

Typical photoconductive test data is seen in FIG. 10. This plot shows the FOM evaluated as a function of electric field for three D1PPV planar devices. The straight cast polymer shows photoconductive FOM of about 1E-12 cm$^2$/V in the range of 1E5 V/cm. Addition of carbon fullerenes was seen to increase the response by at least an order of magnitude, as seen in the middle curve. The upper curve summarizes work to develop more ordered materials by stretch-orientation of the films. Apparently, alignment has altered the conductivity mechanism; the curvature of the FOM vs. field has changed sign. Stretch alignment induces another factor of 2 to 10 improvement in the PC response, resulting in highest FOM of 2E-10 10 cm$^2$/V.

Example 2: Response to Fast Protons

Feasibility of recoil proton detection was evaluated using Sandia's 3 MeV tandem accelerator as a pulsed proton beam stimulus. The measurement circuit was identical to that used for photoconductivity testing. Sweeping the beam past a variable slit produced pulses which were tunable over a wide range by varying the beam current, slit width and sweep speed. Alternatively, the beam could be simply swept on and off the device under test. This technique was useful for integrating radiation dose on the sample to evaluate ion damage in the device.

Figure 11:
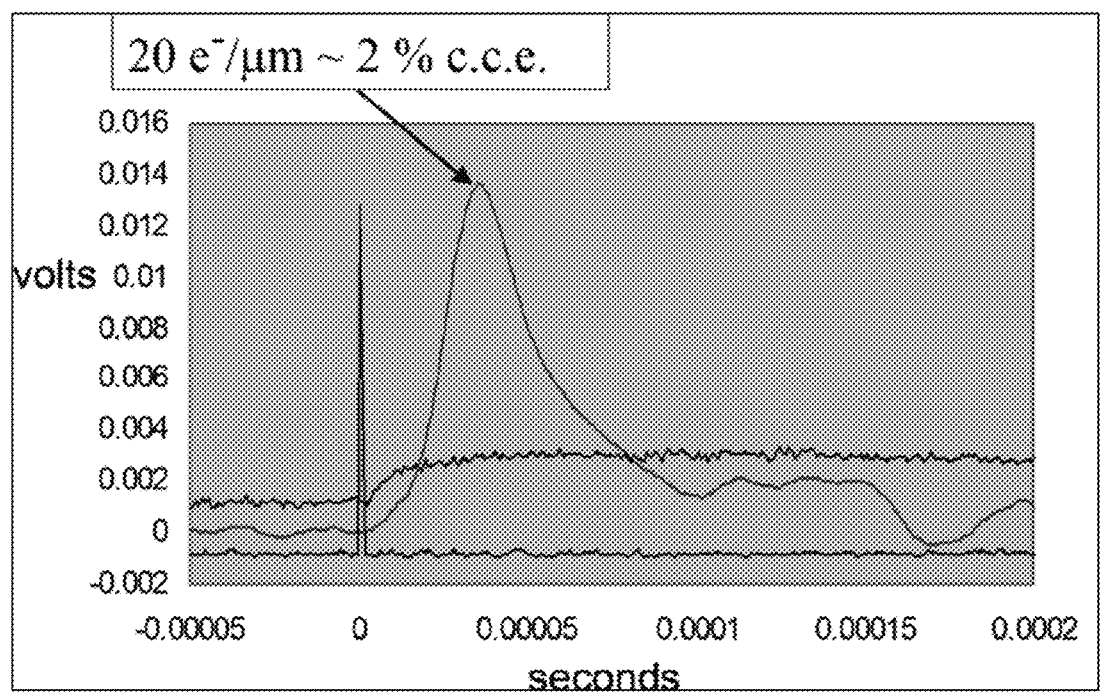
FIG. 11 is a graph showing a transient response of a thin D1PPV IDT to a pulsed proton. Beam.

FIG. 11 shows the response of a thin D1PPV IDT to the pulsed proton beam. The transient is very similar in shape to the photoconductive transient in FIG. 7, peaking at about 50 microseconds. The charge collected in 10 microseconds is estimated to be about 20 electrons per micron of proton track. The charge collection efficiency is estimated to be >1% at fields in the mid 1E5 V/cm. This compares to 10% c.c.e. for photons, which is commensurate with the dE/dx dependence for other kinds of detectors.

Figure 12:
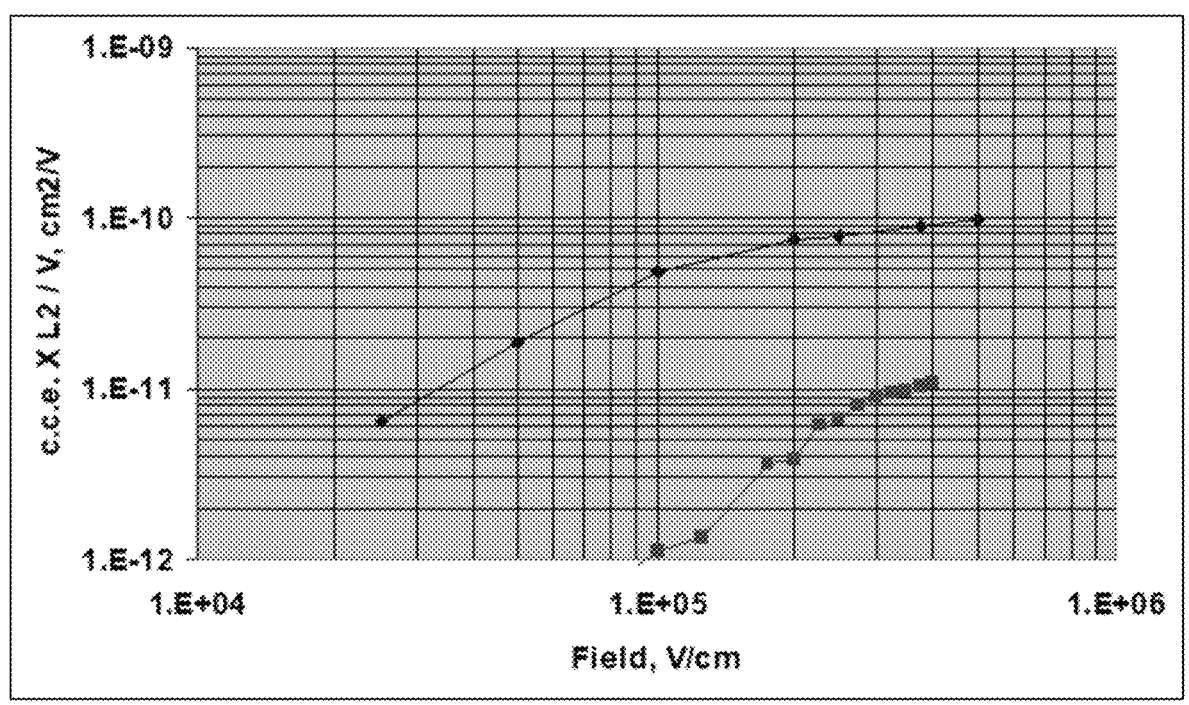
FIG. 12 is plot showing a figure of merit calculated for photons and protons versus electric field strength.

This is further illustrated in FIG. 12, which shows the figure of merit calculated for photons and protons versus electric field strength. The quantum efficiency for photo ionization is well known in the literature, however, for protons it was assumed that three times the band gap energy is dissipated per ionized carrier. The curves in the figure are different by approximately a factor ten, indicating protons ionize the material less efficiently than photons by a similar factor.

Example 3: Radiation Damage

The effect of radiation damage was assessed using the tandem accelerator. Detectors were evaluated for charge the pulse mode figure of merit according to Equation 1 above, then subjected to proton absorbed doses and re-evaluated. The dose and dose rate were increased by a factor of two between each data point by doubling the rep rate of the pulses and exposing for a fixed period of time. The rep rate was reduced to 10 Hz to evaluate FOM. Some short-term recovery was evident during the experiments; therefore, these data represent a conservative estimate of the radiation tolerance of thin D1PPV detectors.

Figure 13:
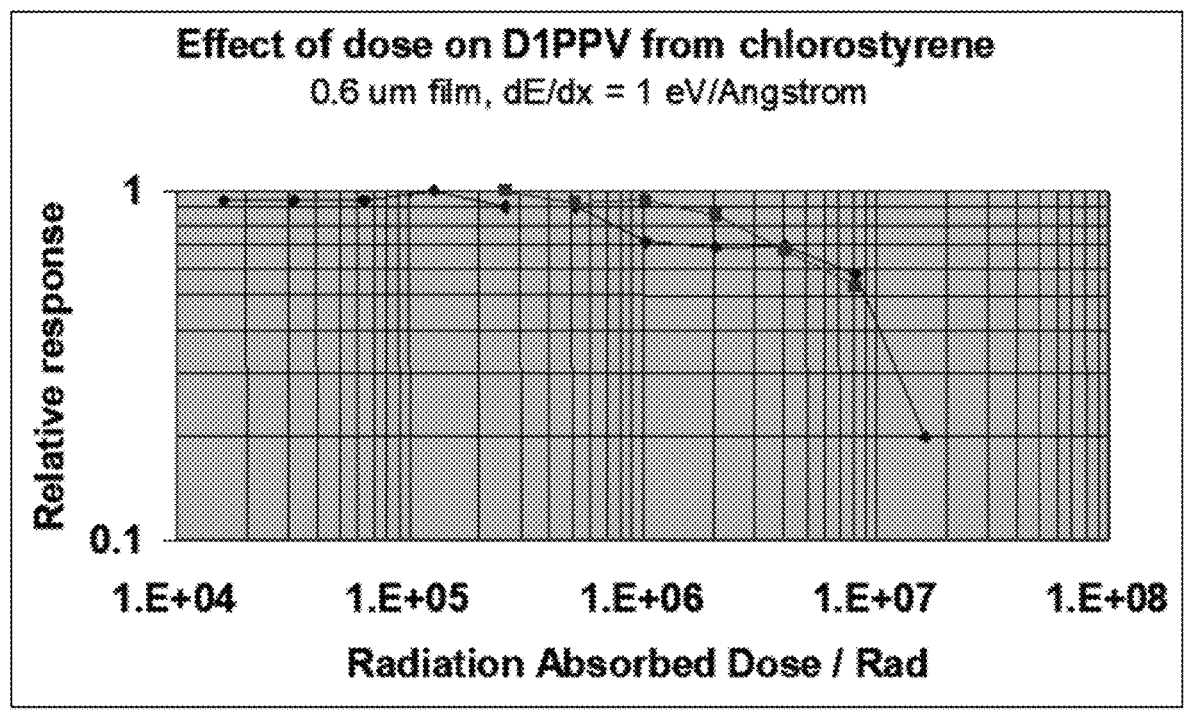
FIG. 13 is a plot showing radiation data of two D1PPV IDT devices on the same chip.

The data are plotted in FIG. 13 for two D1PPV IDT devices on the same chip. The film thickness was 0.6 microns, and dE/dx of 1.0 eV/Angstrom was the assumed energy dissipation (according to TRIM). The signal strength of both devices was nearly constant to accumulated dose of 1E6 rad, as seen in the figure. Degradation of the response slowly increased over the range 1E6-1E7 rad. As seen in the figure, both devices were degraded to about 50% of their original charge collection efficiency at about 10 Mrad.

Example 4: Device Modeling

The above data enable analysis of the feasibility of detecting pulses from individual fission neutrons. The Signal-to Noise Ratio (SNR) analysis is simplified because of the very high resistivity of the polymer material; the dark current for thin detectors under high fields is typically in the low pA range. Assuming the dark current scales linearly with thickness and area, practical devices will have leakage currents below the nA range. Since the analysis is restricted to fast pulse counting (10 microsecond shaping), the parallel noise will be minimal. Under these circumstances, the front-end noise can be assumed to scale linearly with input capacitance.

Accordingly, the noise function published by Ortec for the 142A preamp is assumed as the basis for SNR analysis. Capacitance and leakage current of deep IDT geometry devices was modeled using a commercial FEM code from Field Precision of Albuquerque, NM. Measured capacitance and leakage current or the planar structures was used to validate the approach. Curves representing capacitance as a function of detector area were developed for IDT geometries commensurate with the test structures used for FOM determination. This data was combined with Equation 1 above and the Ortec noise function to compute the required FOM for SNR=1 over a range of absorbed energy, detector area and applied field.

Figure 14:
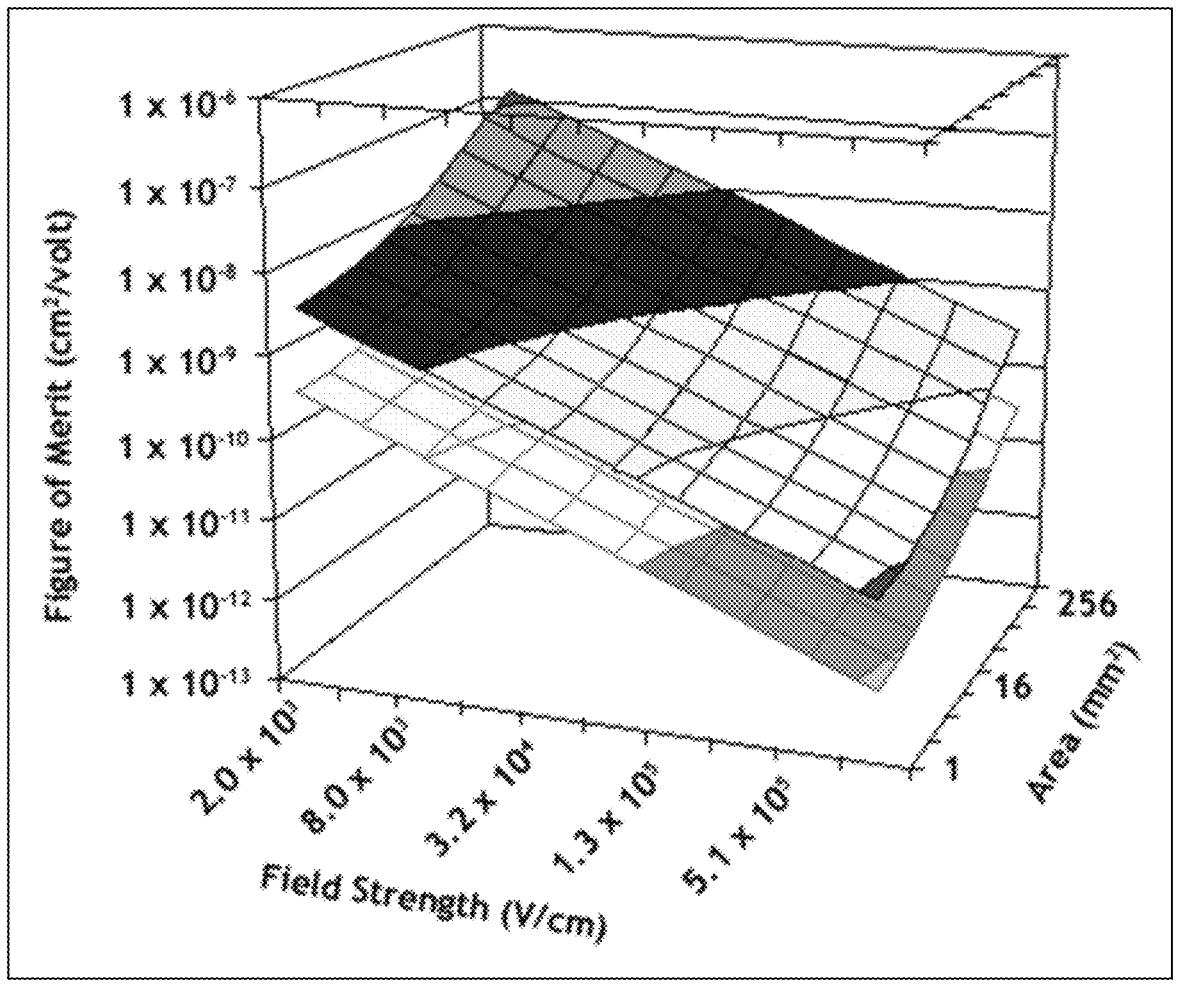
FIG. 14 is a 3-dimensional graph relating the figure of merit, area of detector, and field strength.

FIG. 14 shows a typical result, showing SNR=1 surfaces for 1 and 10 MeV particles calculated for device thickness of 100 microns, contact metal width of 4 microns, gap of 16 microns. It is seen that small detectors with FOM as low as 1E-12 $cm^2/V$ should be capable of fast counting of recoils from fission neutrons. For FOM of 1E-11 $cm^2/V$ equivalent response could be achieved with detector areas up to 1 $in^2$.

Example 5: Fabrication of Devices

Several approaches to the lithography were explored, including direct write ion beam lithography and reactive ion etching. Deep Ion Beam Lithography (DIBL) has been demonstrated to fabricate high-aspect-ratio 3D microstructures in high molecular weight PMMA. DIBL utilizes a MeV-energy ion beam from an accelerator that is focused to a micron-scale spot size for maskless patterning in resist materials.

Figure 15:
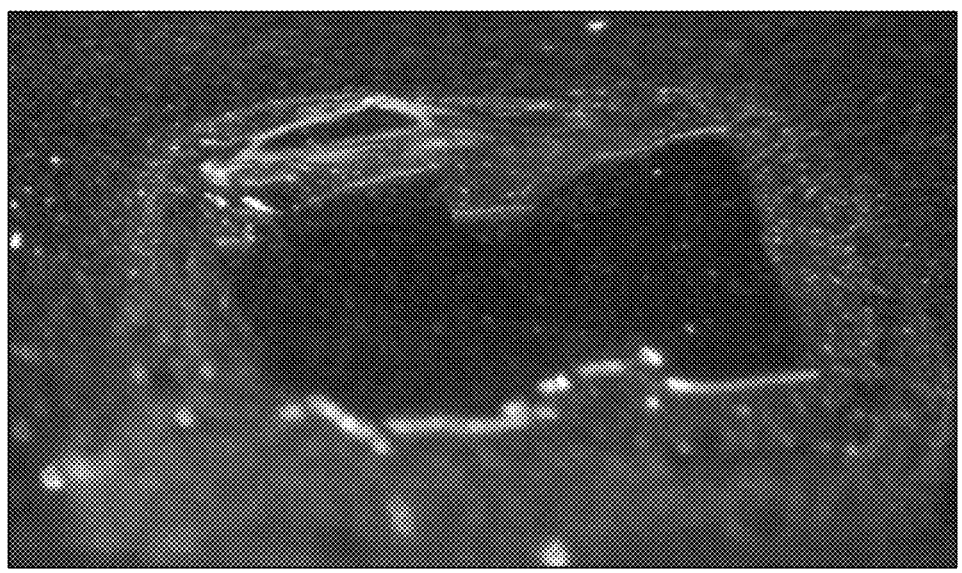
FIG. 15 is a photo showing a D1PPV mesa formed by proton irradiation followed by etching with alcohol.

It was found that D1PPV acts as a negative resist material with respect to 3 MeV protons, obviating the direct-write approach for detector fabrication. FIG. 15 shows a D1PPV mesa formed by proton irradiation followed by etching with alcohol. The effect of radiation is to decrease the solubility of this material. Since patterns defined in this way would receive dose equivalent to the Mrad range, the polymer electronic properties would be expected to degrade significantly by this approach.

Figure 16:
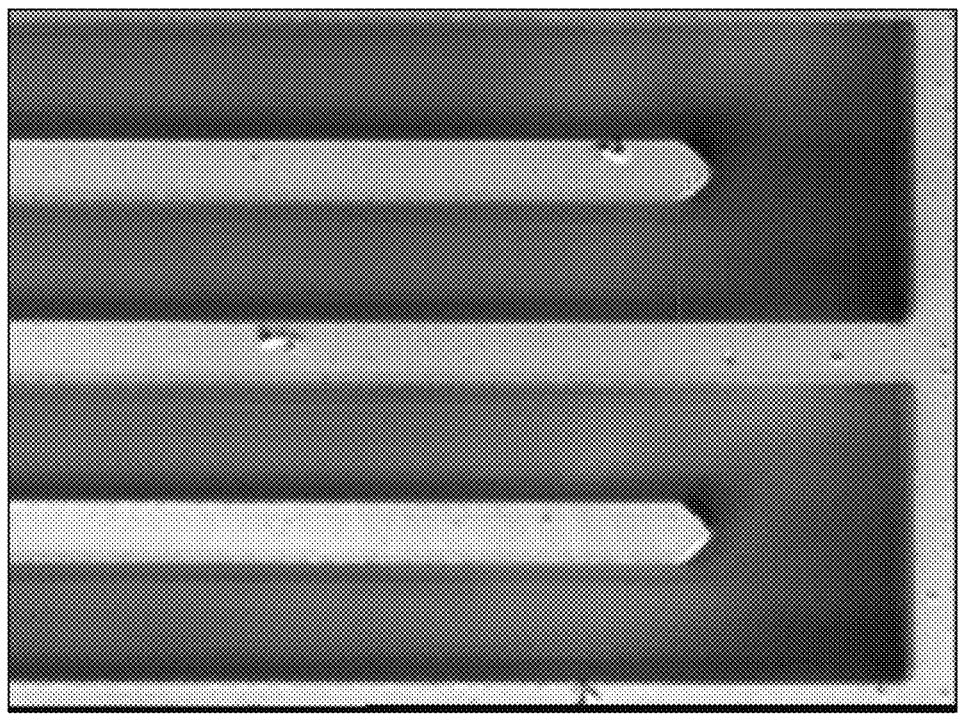
FIG. 16 is an SEM photo of an IDT device was lithographically defined on a smooth polyimide film.

A more practical approach is reactive ion etching through a lithographically defined metal mask to form deep structures. To demonstrate this method, one of the IDT geometry devices was lithographically defined on a smooth polyimide film. FIG. 16 shows one of these devices after ion etching. The channel depth in this example is 25 microns, and the dimensions were maintained to the bottom of the trench. One approach to device fabrication would be to produce structures such as this for the electrodes, and to cast the sensitive polymer into the channel. Alternatively, the sensitive polymer itself could be formed in this fashion using the negative mask.

Figure 17:
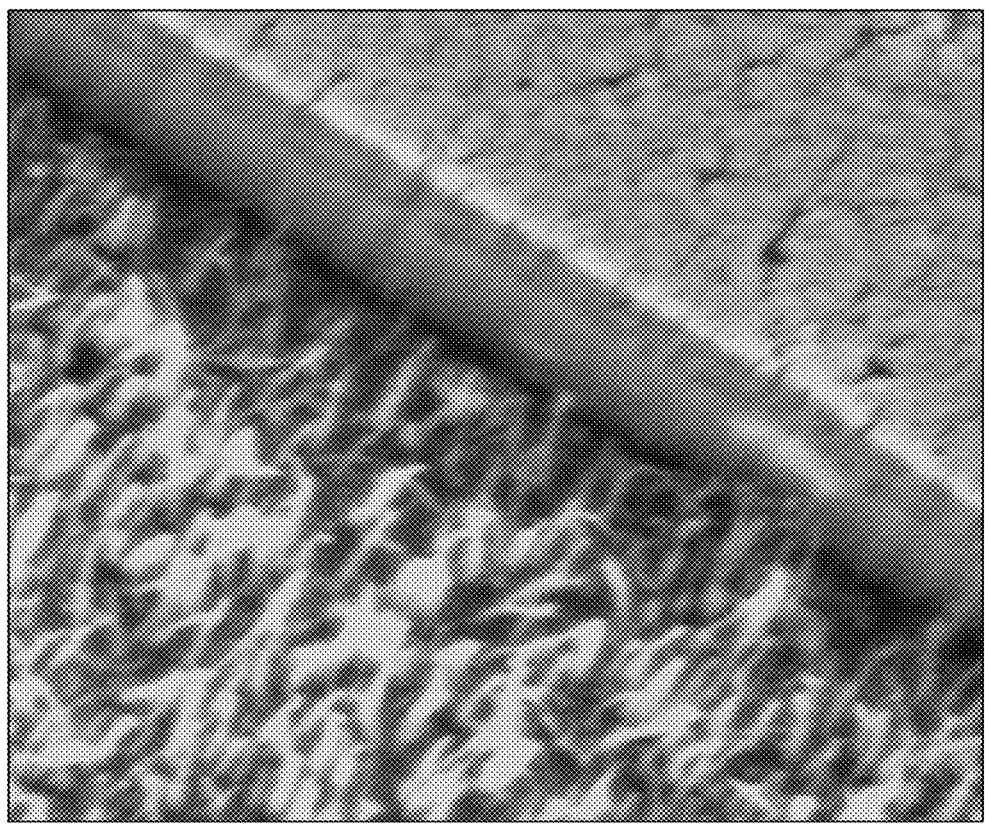
FIG. 17 is an SEM photo of a device with deep ITD structures fabricated directly in D1PPV by ion etching.

An experimental device to explore the feasibility of this approach is seen in FIG. 17. A metal edge mask was defined in a lift-off process using Kapton tape over a D1PPV film. Experiments such as this proved the feasibility of the approach. Following this, a negative mask was generated and deep ITD structures were fabricated directly in D1PPV by ion etching.

FIG. 2 is an SEM micrograph of an ion etched 50 mm D1PPV film. Vertical walls are maintained to the bottom of the channel. This structure was produced using platen temperature of −20° Celsius, a 750 W 1.2-mtorr oxygen plasma and substrate biased to 350 V.

This exploratory research addressed the feasibility of a new kind of radiation detector based on electronic polymers. Direct sensing and imaging of fission neutrons without the use of bulky moderator or tubes was shown to be feasible by measuring the charge collection efficiency of test devices stimulated by fast protons. Methods for casting thick photoconductive material and fabricating the microstructured electrodes capable of directional sensing were explored and demonstrated.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An electronic sensor device comprising:
    an electrically resistive sensing material selected from the group consisting of: a polymer, an oxide, a metal-organic framework material, lithium-containing material, gadolinium-containing material, a boron-containing material, or combinations thereof;
    a three-dimensional electrode structure having a length, width, and height extending at least 0.1 mm, the three-dimensional electrode structure at least partially embedded in the electrically resistive sensing material;
    a power source coupled to terminals of the electrode;
    a voltage source; and
    detector circuitry configured to detect changes in current across the electrodes.

2. The electronic sensor device of claim 1, wherein the electrode has a continuous width with multiple extensions extending length-wise along the continuous width.

3. The electronic sensor device of claim 1, further comprising a second electrode, wherein the electrode and the second electrode each have a continuous width with multiple extensions extending length-wise along the continuous width, and at least some of the multiple extensions of the electrode are interpolated between at least some of the multiple extensions of the second electrode.

4. The electronic sensor device of claim 1, wherein the three-dimensional electrode structure has a length, width, and height extending at least 1 mm.

5. The electronic sensor device of claim 1, wherein the electrically resistive sensing material is an oxide, a lithium-containing material, a gadolinium containing material, or a boron-containing material.

6. The electronic sensor device of claim 5, wherein the electrically resistive material is boron nitride.

7. The electronic sensor device of claim 1, wherein the electrically resistive sensing material is a metal-organic-framework material.

8. The electronic sensor device of claim 1, wherein the electrically resistive sensing material is a conductive polymer.

9. The electronic sensor device of claim 8, wherein the conductive polymer is poly(p-phenylene vinylene).

10. The electronic sensor device of claim 1, wherein the electrically resistive material is stretched in a direction orthogonal to the height of the electrode.

11. The electronic sensor device of claim 1, wherein a shape of the device is configured to be non-planar and to match a body surface.

12. The electronic sensor device of claim 1, wherein the electrically resistive material is selected to have sensitivity to neutrons and gamma rays.

13. The electronic sensor device of claim 1, wherein the detector circuitry is capacitively coupled to the electrodes.

14. The electronic sensor device of claim 13, wherein the detector circuitry is coupled to a computing device, the computing device configured to integrate detected current over time, count current pulses over time, or both.

15. The electronic sensor device of claim 1, wherein the electrode extends to a depth of 10 to 1000 microns in the electrically resistive material.

16. The electronic sensor device of claim 1, wherein multiple three-dimensional electrode structures at least partially embedded in the electrically resistive sensing material are stacked in layers.

17. The electronic sensor device of claim 1, wherein the electrode comprises a carbon-loaded elastomer and the electronic sensor device is flexible.

18. A method for detecting radiation with an electronic sensor device, comprising:
- energizing three dimensional electrodes that are at least partially embedded in an electrically resistive material to form an electric field across channels formed by facing portions of the three-dimensional electrodes;
- detecting current upon radiation encountering the electrically resistive material and the electric field migrating ionized charges from the electrically resistive material towards the electrodes;
- wherein the electrically resistive sensing material is selected from the group consisting of: a polymer, an oxide, a metal-organic framework material, lithium-containing material, gadolinium-containing material, a boron-containing material, or combinations thereof;
- wherein the electrodes have a length, width, and height each extending at least 0.1 mm.

19. The method of claim 18, further comprising directing radiation for medical therapy to the electronic sensing device, and monitoring the detected radiation for a predetermined dosage, wherein the electronic sensing device is placed on a patient in need of the medical therapy.

20. The method of claim 19, further comprising, manufacturing the electronic sensing device to have a non-planar surface matching a body surface of the patient.

* * * * *